United States Patent

Bang et al.

[11] Patent Number: 6,063,198
[45] Date of Patent: May 16, 2000

[54] HIGH PRESSURE RELEASE DEVICE FOR SEMICONDUCTOR FABRICATING EQUIPMENT

[75] Inventors: Won Bang, San Jose; Visweswaren Sivaramakrishnan; Estela Guijosa, both of Santa Clara, all of Calif.

[73] Assignee: Applied Materials, Inc., Santa Clara, Calif.

[21] Appl. No.: 09/009,907

[22] Filed: Jan. 21, 1998

[51] Int. Cl.[7] .................................................. C23C 16/00
[52] U.S. Cl. ..................... 118/715; 118/692; 118/708; 137/68.19; 137/68.23; 137/68.25; 220/89.2
[58] Field of Search .................... 118/715, 692, 118/708, 710, 707; 137/68.23, 68.19, 68.25; 220/89.2

[56] References Cited

U.S. PATENT DOCUMENTS

| | | | |
|---|---|---|---|
| 3,612,391 | 10/1971 | Knoos | 230/54 |
| 3,709,239 | 1/1973 | Morck, Jr. | 137/68 |
| 4,207,913 | 6/1980 | Filke, Jr. | 137/68 |
| 4,208,375 | 6/1980 | Bard | 422/225 |
| 4,505,289 | 3/1985 | Wilson | 137/68 |
| 4,621,655 | 11/1986 | Roche | 137/81.2 |
| 4,949,671 | 8/1990 | Davis et al. | 118/725 |
| 5,620,659 | 4/1997 | Revesz | 422/90 |
| 5,653,885 | 8/1997 | Jameson et al. | 210/634 |
| 5,871,813 | 3/1997 | Pham | 427/248.1 |
| 5,885,356 | 3/1999 | Zhao et al. | 118/723 |

*Primary Examiner*—Jan H. Silbaugh
*Assistant Examiner*—Dae Young Lee
*Attorney, Agent, or Firm*—Townsend & Townsend & Crew

[57] ABSTRACT

The present invention provides an improved device, system, and method for handling accidental explosions in a substrate processing chambers typically used in chemical vapor deposition (CVD). In particular, the invention channels the force from an explosion into alternate pathways leading away from the substitute processing chamber. In one embodiment, the high pressure release device for a semiconductor manufacturing system comprises of a diaphragm adapted to burst above a predetermined pressure. When installed in the system, the diaphragm is in fluid contact with the substrate processing chamber and covers the entrance to an exhaust passage which channels excess pressure away from the chamber.

12 Claims, 4 Drawing Sheets

HIGH PRESSURE RELEASE DEVICE FOR SEMICONDUCTOR FABRICATING EQUIPMENT

BACKGROUND OF THE INVENTION

The present invention generally relates to the fabrication of integrated circuits. More particularly, the invention provides a high pressure release device for handling sudden bursts of excess pressure within a semiconductor processing chamber. The present invention is particularly useful for releasing the pressure within chemical vapor deposition (CVD) chambers, but also finds uses in ion implantation chambers, etching chambers, and other chamber types.

High density integrated circuits, commonly termed VLSI devices, are typically formed on semiconductor wafers by subjecting the wafers to a number of deposition, masking, doping and/or etching processes. The wafers are placed onto a pedestal or susceptor within a process chamber and process gas(es) delivered into the chamber perform the various deposition and etching steps on the wafer. For example, one typical process involves delivering silane ($SiH_4$) and nitrogen ($N_2$) into the process chamber while applying RF energy to form a plasma for depositing silicon nitride ($Si_3N_4$) on the wafer. During each step, once the appropriate layers have been deposited and/or removed from the wafer, the remaining plasma and gas residue are withdrawn from the process chamber by a suitable vacuum source, such as a pump.

Occasionally, due to an error in the combination of the process gases or the presence of undesired reagents in the processing chamber, an explosion or a sudden burst of pressure may occur in the semiconductor processing chamber. The force from the explosion may damage gas flow valves and other moving parts upstream and downstream of the processing chamber. The resulting explosion also typically forces some portion of the chamber, usually the lid, to break its air-tight seal with the chamber, releasing process gas into the surrounding environment.

In addition to the internal damage sustained by the chamber, the release of these chemicals into the open environment poses a secondary and sometimes more serious health risk to those people working near the chamber. In many instances, the process gases and chemicals used inside the semiconductor processing chamber are toxic to the human body or explosive when exposed to ambient air or water.

Therefore, improved safety methods and apparatus for controlling sudden explosions which may occur within a semiconductor processing chamber are needed in the semiconductor manufacturing industry. To date, the use of pressure fail-safe mechanisms in processing chambers is an important, yet generally unaddressed consideration. These methods and apparatus should improve work conditions for those people near the processing chamber by preventing the release of process gases into the open environment. These methods and apparatus should further minimize internal damage to the chamber by relieving pressure as it builds from the explosion.

SUMMARY OF THE INVENTION

The present invention provides an improved device, system, and method for handling sudden pressure bursts in a semiconductor manufacturing system. In particular, the invention channels the force from a pressure burst into alternate pathways typically leading away from the process chamber. Advantageously, this minimizes the risk of process gas leakage into the open environment by relieving excess pressure before gas containment in the chamber is breached.

The present invention comprises a high pressure release device for use in a semiconductor manufacturing system having a release cover adapted to allow the release of gas when the gas is at a pressure above a predetermined level. The term "release" as used herein is defined as setting the excess pressure free from the system or directing the pressure to another, less pressure-sensitive portion of the system. The release cover is coupled to an exhaust passage and is in fluid contact with a substrate processing chamber. The entrance of the exhaust passage is substantially sealed by the cover. This ensures that gas enters the exhaust passage only when pressure exceeds a predetermined level and that the gas flow path in the semiconductor system is not altered during normal operations. In a preferred embodiment, the cover is a diaphragm adapted to burst above a predetermined pressure. This provides a simple and cost-effective solution that can be retrofitted into older systems. Alternatively, the cover may be an articulating valve having a flap adapted to open above a predetermined pressure.

Additionally in further embodiments of the invention, the cover may be formed as part of a conduit connecting device which will facilitate installation of the release device. When used in a conduit connecting device, the cover may be a flange having a diaphragm connected by an electron beam weld to a bore of the flange. As described, the diaphragm is adapted to burst above a predetermined pressure. A locking clamp removably couples the flange to the exhaust passage and, typically, one other passageway. The exhaust passage is coupled to a foreline of the substrate processing chamber in the semiconductor manufacturing system.

In one embodiment, the cover forms a portion of an inner surface of the substrate processing chamber. Alternatively, the cover is coupled directly to a discharge conduit of the substrate processing chamber. The exhaust passage is typically coupled by the connection device to the discharge conduit at a location upstream from a throttle valve. The exhaust passage connects to a foreline downstream from the throttle valve.

A semiconductor manufacturing system of the present invention comprises a housing having a substrate processing chamber and a lid fixedly secured to the housing by a locking device. A discharge conduit fluidly couples the gas outlet and a high pressure release device which is in fluid contact with the chamber. A vacuum system fluidly coupled to the exhaust line provides a pressure within the processing chamber between about 0.2 and 760 Torr. A substrate being processed in the chamber rests on a pedestal with a support surface. The high pressure release device may be a rupture diaphragm or an articulated valve.

A method according to the present invention for releasing high pressure from a semiconductor manufacturing system includes flowing a process gas into a substrate processing chamber. The entrance into the pressure release conduit of the processing chamber is covered with a high pressure release device. When the pressure inside the processing chamber exceeds a predetermined level, excess pressure is relieved or released by flowing gas from the chamber through the pressure release conduit. The release of gas from the chamber may involve bursting a diaphragm or forcing open an articulated valve with pressure from the processing chamber.

These and other embodiments of the present invention, as well as its advantages and features, are described in more detail in conjunction with the text below and attached figures.

DESCRIPTION OF THE PREFERRED EMBODIMENT

I. Overview of CVD Reactor

Figure 1:
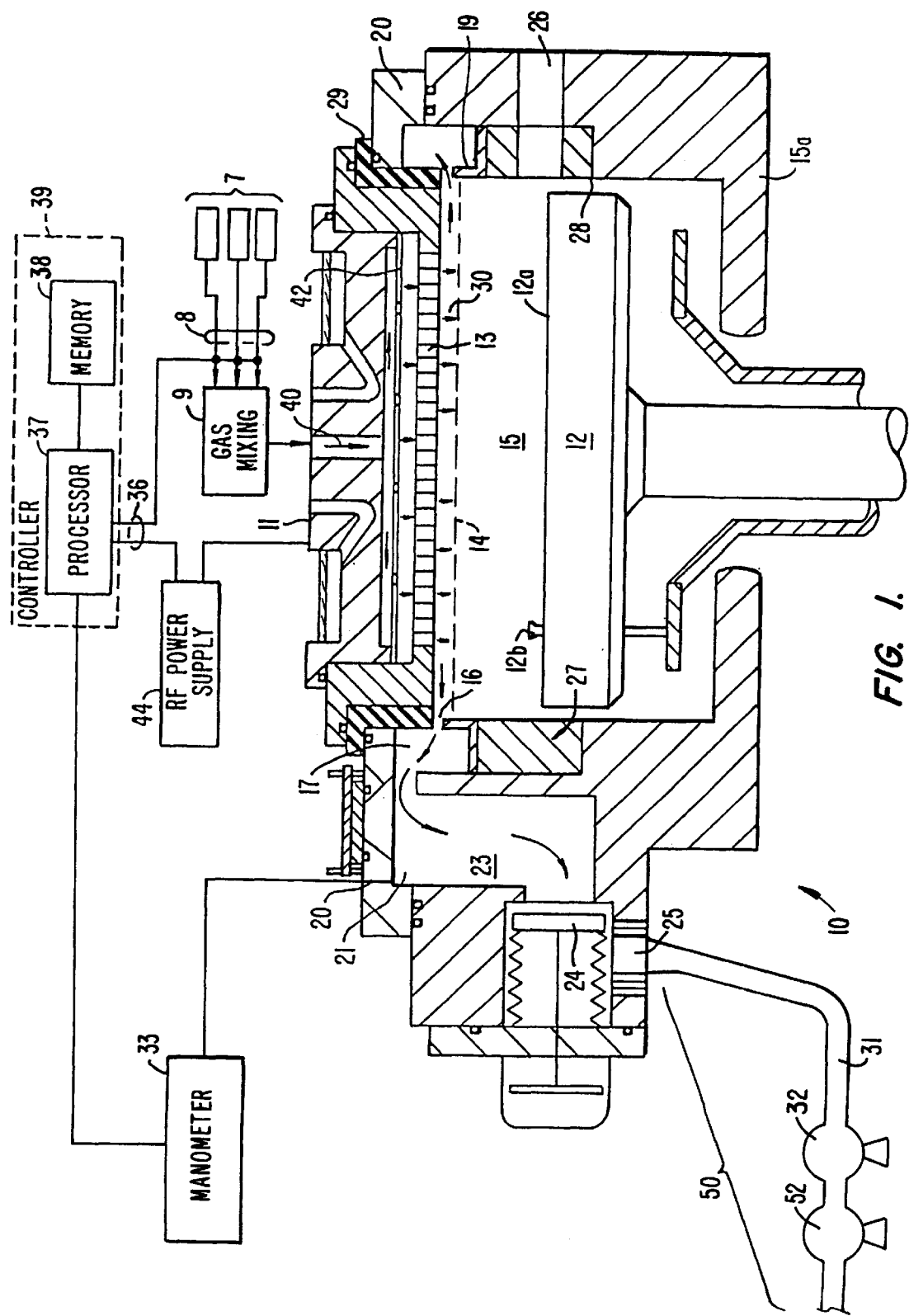
FIG. 1 is a vertical cross-sectional view of a representative semiconductor manufacturing system.

The present invention is useful as a pressure release device for a variety of semiconductor processing systems. One such system, a CVD system, is shown in FIG. 1, which is a vertical, cross-sectional view of a CVD reactor 10 having a vacuum or processing chamber 15 within a housing or chamber wall 15a. The reactor 10 as shown in FIG. 1 can perform thermal CVD processes which supply processes gases to a substrate surface where heat-induced chemical reactions (homogeneous or heterogeneous) take place to produce a desired film.

Reactor 10 contains a gas distribution manifold 11 for dispersing process gases to a substrate (not shown) that rests on a heater pedestal 12 centered within the process chamber. More specifically, deposition process gases flow into the chamber 15 through the inlet manifold 11 indicated by arrow 40, through a conventional perforated blocker plate 42 and then through holes in gas distribution faceplate 13. Process gases used in the chamber 15 may include a deposition gas that provides the material for forming layers on the substrate combined with a carrier gas for facilitating the movement of the deposition gas or may include a cleaning gas that etches away unwanted material deposited from the deposition gas.

Before reaching the manifold 11, deposition and carrier gases are input from gas sources 7 through gas supply lines 8 into a mixing system 9 where they are combined and then sent to manifold 11. Generally, the supply line for each process gas includes (i) several shut-off valves (not shown) that can be used to automatically or manually shut off the flow of process gas into the chamber, and (ii) mass flow controllers (also not shown) that measure the flow of gas through the supply line. When toxic gases are used in the process, the several shut-off valves are positioned on each gas supply line in conventional configurations.

During processing, the substrate (e.g., a semiconductor wafer) is positioned on a flat (or slightly convex) surface 12a of pedestal 12. The pedestal 12 can be moved controllably between a lower loading/off-loading position (depicted in FIG. 1) and an upper processing position (indicated by dashed line 14 in FIG. 1), which is adjacent to manifold 11. A lift mechanism and motor (not shown) raises and lowers the heater pedestal assembly 12 and its wafer lift pins 12b as wafers are transferred into and out of the body of the chamber by a robot blade (not shown) through an insertion/removal opening 26 in the side of the CVD reactor 10. A motor raises and lowers pedestal 12 between a processing position 14 and a lower, wafer-loading position. A center-board (not shown) includes sensors for providing information on the position of the wafers.

In processing chamber 15, the inside of the chamber wall 15a is covered by upper and lower annular dielectric liners 19 and 27 (although a single liner could be used). The upper liner 19 rests on the lower liner 27, which rests on a shelf 28 on the chamber wall. Typically, any or all of the chamber lining, gas inlet manifold faceplate, and various other reactor hardware are made out of material such as aluminum or anodized aluminum. Additionally, the inside surface of the chamber lid 20 is covered by an insulator 29 which insulates the gas distribution plate 13 from the chamber lid 20. Details on a suitable insulator 29 can be found in U.S. Pat. No. 5,558,717 entitled "CVD Processing Chamber," issued to Zhao et al., the complete disclosure of which is incorporated herein by reference.

The deposition process performed in reactor 10 can be either a thermal process or a plasma enhanced process. In a plasma enhanced process, a radio frequency (RF) power supply 44 applies electrical power between the gas distribution faceplate 13 and the pedestal to excite the process gas mixture to form a plasma within the cylindrical region between the faceplate 13 and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15.

During deposition processing, gas supplied to plate 13 is vented toward the wafer surface (as indicated by arrows 30), where it may be uniformly distributed radially across the wafer surface, typically in a laminar flow. Gas that is not deposited on the wafer, including reaction products, is evacuated from the chamber by a vacuum pump or system (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown). The pump (not shown) disposed exterior to reactor 10 provides vacuum pressure within exhaust plenum 17 to draw both the process and purge gases out of chamber 15 and through the exhaust plenum 17 and extension portion 21, where they are discharged from reactor 10 along a discharge conduit 31.

As shown in FIG. 1, the controller 39 controls all of the activities of the reactor 10, including the control of gas input from gas sources 7 through gas supply lines 8 to mixing system 9 and RF power supply 44. The controller 39 executes system control software, which is a computer program stored in a computer-readable medium such as a memory 38.

The flow rate of the gases from the exhaust plenum 17 is preferably controlled by throttle valve 32 which is suitably disposed along conduit 31. The pressure within processing chamber 15 is monitored with a manometer 33 and controlled by varying the flow cross-sectional area of conduit 31 with throttle valve 32 (discussed in further detail below). Preferably, controller 39 receives signals from manometer 33 that indicate the chamber pressure. Processor 37 in the controller 39 will compare the measured pressure value with set point pressure values entered by operators (not shown), and determine the necessary adjustment of throttle valve 32 that is required to maintain the desired pressure within chamber 15. The controller 39 then relays an adjustment signal to a drive motor (not shown), which adjusts throttle valve 32 to a proper setting corresponding to the set point pressure value.

Referring to FIG. 1, a valve assembly 50 includes throttle valve 32 and an isolation valve assembly 52 disposed along a discharge conduit 31 between throttle valve 32 and a gas outlet 25 of process chamber 15. Isolation valve assembly 52 may be used to isolate process chamber 15 from the pump to minimize the reduction of chamber pressure due to the pumping action of the pump. Isolation valve assembly 52, together with throttle valve 32, may also be used to calibrate the liquid flow controllers (not shown) of reactor 10. In some processes, liquid dopants are vaporized, and then delivered into process chamber 15 along with a carrier gas. The liquid flow controllers (LFCs) are used to monitor the flow rate of the liquid dopants into the chamber 15. During calibration of the LFCs, isolation valve assembly 52 restricts or limits the gas flow to throttle valve 32 to maximize the pressure increase in chamber 15, which facilitates LFC calibration.

Vapor deposition reactor 10 is preferably attached to a mainframe unit (not shown) which provides electrical, plumbing and other support functions for the apparatus 10. Mainframe units that are compatible with the illustrative embodiment of vapor deposition reactor 10 are currently commercially available as the Precision 5000™ and the Centura 5200™ systems from Applied Materials, Inc., of Santa Clara, Calif. Further details on suitable mainframe units and additional chamber components may be found in commonly assigned, co-pending U.S. patent application Ser. No. 08/748,883, filed Nov. 13, 1996 (Attorney Docket No. 16301-015900), the complete disclosure of which is incorporated herein by reference.

The CVD apparatus description presented above is mainly for general illustrative purposes and should not be considered as limiting the scope of the present invention. As previously mentioned, the present invention is applicable to a variety of substrate processing chambers including etching chambers, ion implantation chambers, and the like.

II. Pressure Release Device

Figure 2:
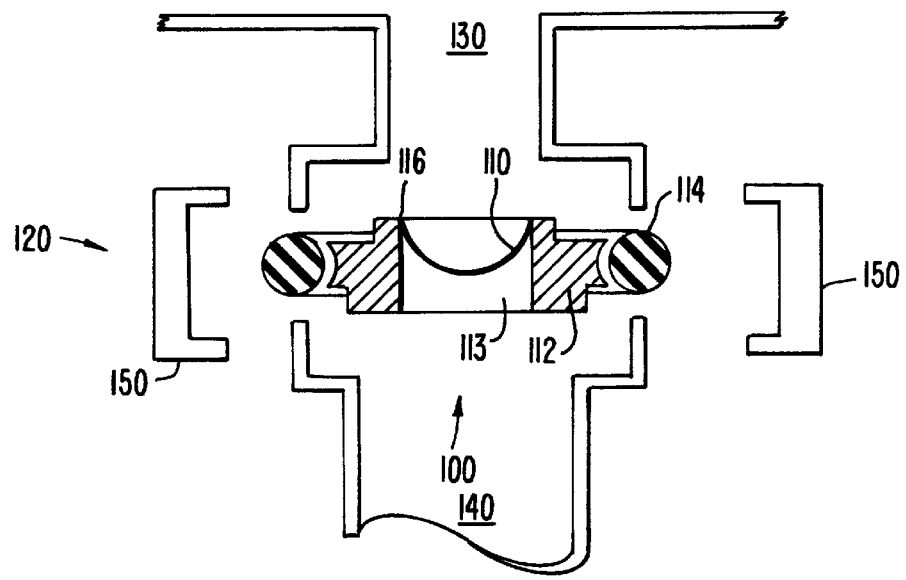
FIGS. 2–3 are cross-sectional views of a preferred embodiment of a high pressure release device according to the present invention.
Figure 3:
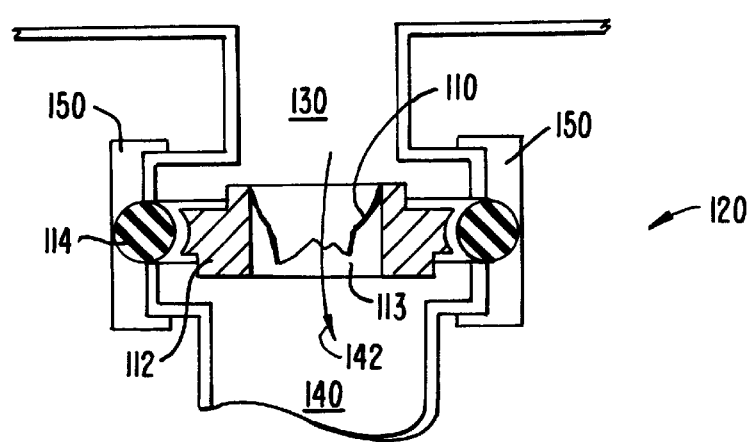
Figure 4:
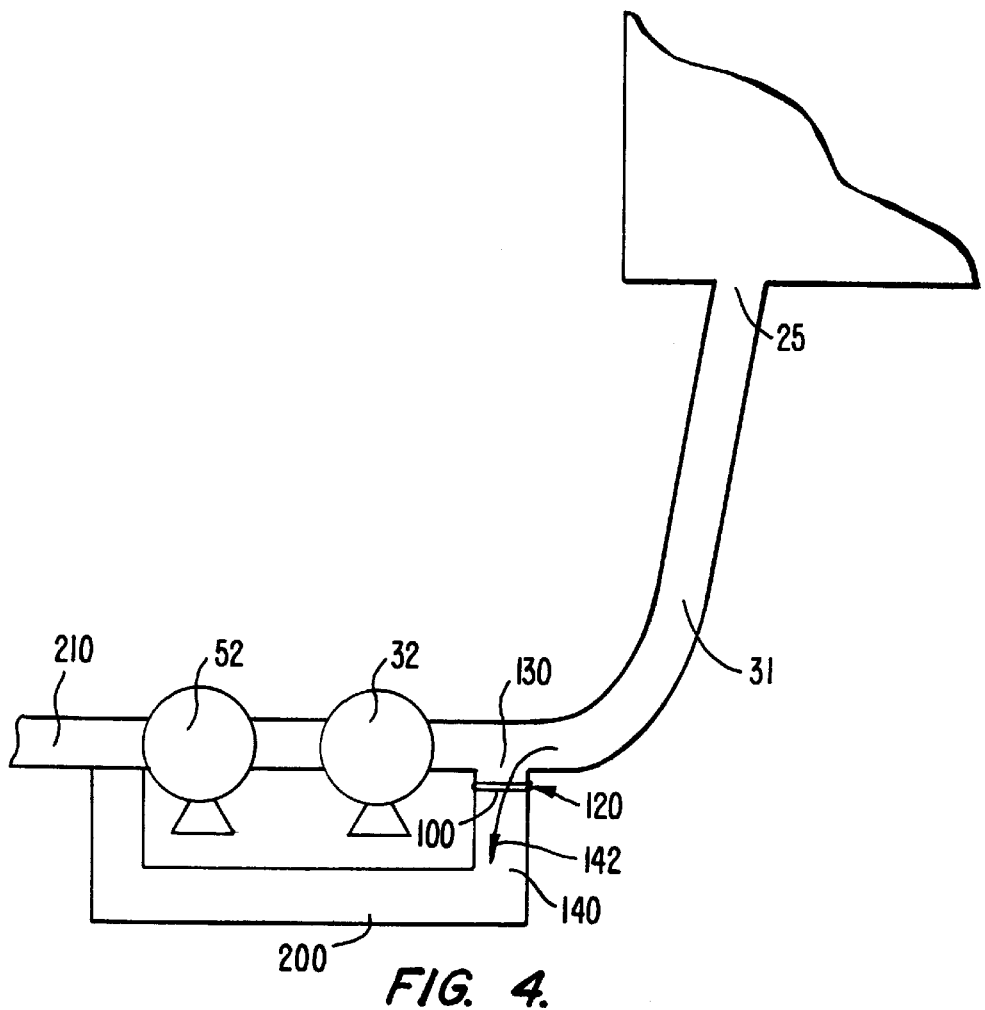
FIG. 4 shows a high pressure release device of the present invention positioned in a bypass exhaust conduit.

Referring now to FIGS. 2–4, a high pressure release device of the present invention for use with a substrate processing system, such as a CVD reactor 10 mentioned above, will now be described. Although the high pressure release device 100 is described as being coupled to the discharge conduit 31, it should be understood that the high pressure release device 100 may be used in other areas of the CVD reactor 10 so long as the device remains in fluid contact with the CVD chamber 15. By "fluid contact," it is meant that an uninterrupted fluid path exists between the high pressure release device 100 and the process chamber 15 of the CVD reactor 10. This uninterrupted flow path allows the high pressure release device 100 to experience pressure changes approximating those occurring inside the chamber 15. Preferably, this also allows excess pressure to be released by a device external to or spaced apart from the chamber 15. Advantageously, providing a pressure release further allows the lid 20 of the process chamber 15 to be immovably coupled to the chamber wall 15a, since the lid does not need to act as a venting mechanism.

Referring now to FIG. 2, a preferred embodiment of the high pressure release device 100 comprises a diaphragm 110 mounted in a flange 112 having a bore 113 and an elastomeric sealing ring 114. The diaphragm 110 is typically secured to an inner circumference of the bore 113 through an electron beam weld 116. Although the bore 113 is depicted as having a circular circumference, neither the bore 113 nor the diaphragm 110 are limited to such a configuration. In this embodiment, the high pressure release device 100 is designed as part of a conduit connecting device 120 used to couple the openings of pipe 130 and pipe 140. Although the pipes 130 and 140 are described in the context of being connected to discharge conduit 31, pipes 130 and 140 could also be coupled directly to the chamber wall 15a of the CVD reactor 10. Flange 112 containing the diaphragm 110 may also be inserted into pipe junctures at other locations in the CVD system as desired. A locking clamp 150 is used to secure the flange 112 between the pipes 130 and 140, as shown in FIGS. 2 and 3. The elastomeric ring 114 on the flange provides an air-tight connection between the ends of two adjoined pipes 130 and 140. Incorporating the diaphragm 110 into a conduit connecting device desirably allows for easy diaphragm replacement since components located at a juncture between two pipes are more easily removed and replaced.

Although the diaphragm 110 shown in FIGS. 2 and 3 is hemispherical in shape, it should be understood that the diaphragm may assume a variety of other shapes, such as a flat square or disc, which bursts when pressure exceeds a predetermined level. The bursting pressures selected for these diaphragms are process dependent and different processes will require different diaphragms. In one embodiment, the bursting pressure for a diaphragm 110 is at 900 Torr. However, some processes such as atmospheric pressure CVD or subatmospheric CVD require diaphragms adjusted to burst at lower suitable pressures. Although not limited in this manner, the diaphragm is typically set to burst at pressures about 20% higher than normal operating pressures. In situations where explosions occur, however, the pressure increase may be significantly more than 20% over normal pressures and thus the predetermined bursting pressure may also be set higher since the pressure increase may also be significantly higher.

As shown in the figures, the diaphragm 110 is preferably positioned so that its concave side is in fluid contact with areas of the chamber most likely to experience high pressures. However, the diaphragm 110 may be oriented in a variety of positions so long as it will burst at pressures above a predetermined bursting pressure. Preferably, the diaphragm 110 and the flange 112 are made of materials such as nickel or stainless steel which provide the desired material strength while being resistant to the process and deposition gases used in the CVD reaction chamber 10. It should be understood that other materials having similar characteristics may be used as well. The thickness of the diaphragm varies depending on the material used.

As shown in FIG. 3, after the diaphragm 110 has burst, fluid rushes through the bore 113, as indicated by arrow 142, from pipe 130 into pipe 140, which had previously been sealed by the diaphragm 110 and the flange 112. Although FIGS. 2 and 3 show the diaphragm 110 used as part of flange 112, it should be understood that the diaphragm 110 may be electron beam directly welded or otherwise connected to a passage such as pipe 130. Additionally, high pressure release device 100 need not be used as part of a conduit connecting assembly 120.

Referring now to FIG. 4, the conduit connecting device 120 having the pressure release device 100 preferably connects bypass exhaust passage 200 to the discharge conduit 31 of the CVD reactor 10. As shown in the figure, bypass exhaust passage 200 directs the excess pressure around the throttle valve 32 and the isolation valve 52. The release device 100 may be placed flush with the surface of discharge conduit 31 or recessed as shown in FIG. 4. The bypass exhaust passage 200 allows pressure to be released downstream into a foreline 210 without having to pass through valves 32 and 52 whose moving parts may be damaged by the high pressures. During normal operations, the bypass exhaust passage 200 is sealed from the discharge conduit 31 by the high pressure release device 100 in the conduit connecting device 120. As noted, when pressure inside the chamber 15 and discharge conduit 31 exceeds a predetermined level, such as 700 Torr, the diaphragm 110 in the conduit connecting device 120 will burst allowing fluid to flow into bypass exhaust passage 200 toward the foreline 210. Preferably the predetermined pressure is set at a level that typically will not be triggered during the course of normal operations. As mentioned, release device 100 allows the chamber lid 20 to be fixedly secured to the chamber wall 15a once processing begins. This prevents the accidental release of toxic process gases into the open environment surrounding the CVD reactor 10.

Figure 5:
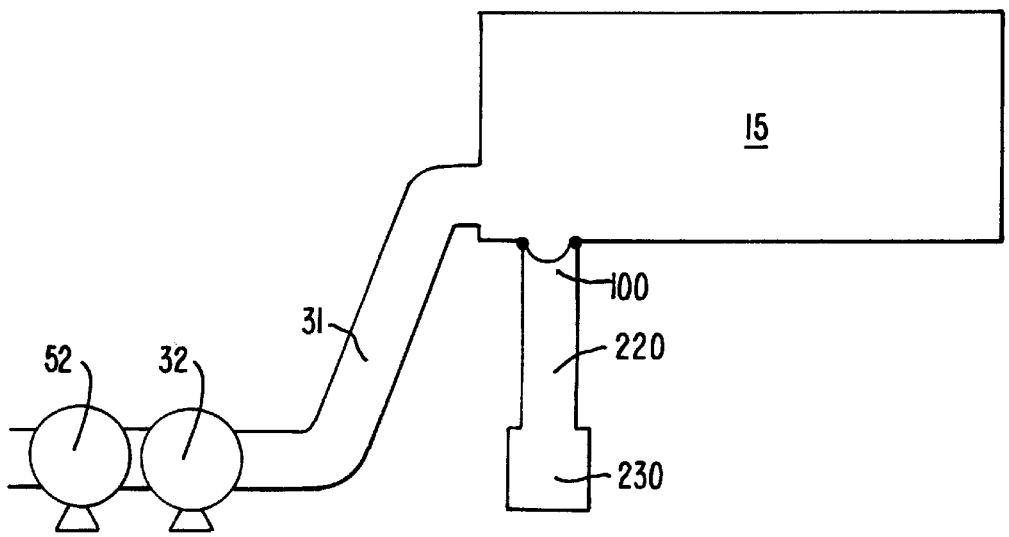
FIG. 5 depicts a high pressure release device of the present invention integrated into the wall of a substrate processing chamber.

In an alternative embodiment shown in FIG. 5, the pressure release device 100 forms part of the inner surface of the process chamber 15 such that when pressures exceed a predetermined level, the high pressure release device 100 will allow fluid from the chamber 15 to flow into an outlet conduit 220 leading to a reservoir 230. Placing the release device 100 closer to the source of most high pressure bursts allows for a quicker response in releasing the undesired pressure. The device 100 may be incorporated directly into the wall 15a of the chamber 15 or it may be connected to a gas line near the chamber 15.

Figure 6:
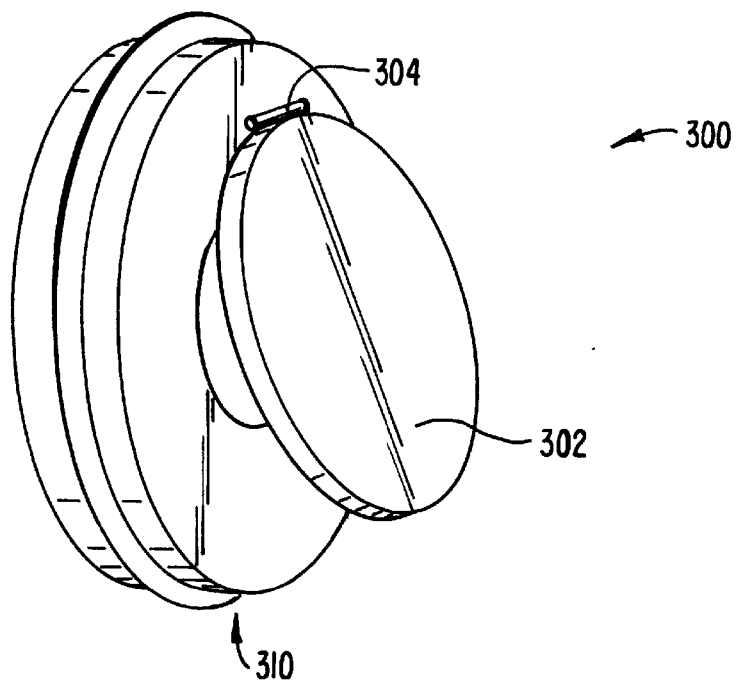
FIG. 6 is a perspective view of an alternate embodiment of a high pressure release device of the present invention.
Figure 7:
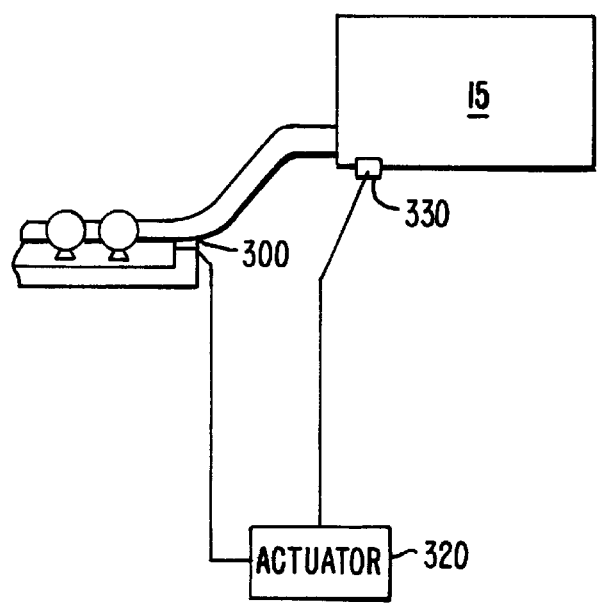
FIG. 7 is a schematic view of the device of FIG. 6 relative to the substrate processing chamber.

In a still further embodiment shown in FIG. 6, the release device 100 may comprise an articulated valve 300 which opens only when pressure exceeds a predetermined level. The valve 300 preferably has a disc-like cover or flap 302 which is attached by a hinge 304 that forces the flap 302 into a closed position which seals against the flange 310. The force from an explosion would open the flap 302 and allow the release of the excess pressure. The articulated valve 300 and flange 310 can also be incorporated as part of a conduit connecting device 120 (FIG. 4) or formed as part of the inner surface of chamber 15 (FIG. 5). Advantageously, this valve 300 would not require replacement after a single use. In a still further alternative embodiment, the valve 300 could be activated by an actuator 320 (FIG. 7) such as a step motor or pneumatic piston upon detection of a pressure burst in the chamber 15 by a pressure sensor 330 located therein.

While the above is a full description of the specific embodiments, various modifications, alternative constructions and equivalents may be used. For example, although the invention is shown in the enclosed drawings and described as a single wafer chamber, it is not intended to be limited in this manner. That is, the invention can be used in a variety of processing chambers, such as etch chambers, diffusion chambers or the like. The present invention could be installed into a batch chamber that simultaneously processes a plurality of wafers. In addition, the invention would be suitable for use in a multi-wafer chamber that sequentially performs individual processing steps on each of the wafers.

What is claimed is:

1. A semiconductor manufacturing system comprising:
  a housing having a substrate processing chamber;
  a lid having a locking device for securing the lid to said housing;
  an exhaust line fluidly coupled to a gas outlet of said substrate processing chamber;
  a high pressure release device in fluid contact with said substrate processing chamber adapted to reduce internal damage to the chamber and to prevent release of process gases into a surrounding environment by relieving excess pressure in the chamber;
  a vacuum system fluidly coupled to said exhaust line for providing a desired pressure within the processing chamber; and
  a pedestal with a support surface for supporting the semiconductor wafer thereon.

2. A system of claim 1 wherein the high pressure release device is a rupture diaphragm.

3. A system of claim 1 wherein said lid is fixedly secured to said housing.

4. A system of claim 1 wherein said vacuum system provides a desired pressure between about 0.2 and 760 torr.

5. A system of claim 1 wherein the high pressure release device is coupled to an exhaust passage coupled to a foreline of the substrate processing chamber in said semiconductor manufacturing system.

6. A system of claim 1 wherein the high pressure release device is coupled to an exhaust passage connected to a discharge conduit upstream from a throttle valve and connected to a foreline downstream from the throttle valve.

7. A system of claim 1 wherein the high pressure release device forms a portion of an inner surface of the substrate processing chamber.

8. A system of claim 1 wherein the high pressure release device is coupled to an outlet conduit of said substrate processing chamber.

9. A system of claim 1 wherein the high pressure release device comprises a flap adapted to open at pressures above a predetermined pressure.

10. A system of claim 1 wherein the high pressure release device comprises a flange and a diaphragm connected with a bore of the flange, the diaphragm configured to burst at pressure above a predetermined pressure.

11. A system of claim 10 further comprising a locking clamp which removably couples the flange to the exhaust line.

12. A system of claim 10 wherein the predetermined pressure is about 900 Torr.

* * * * *